US011853567B2

(12) United States Patent
Hung et al.

(10) Patent No.: US 11,853,567 B2
(45) Date of Patent: *Dec. 26, 2023

(54) DATA RETENTION IN MEMORY DEVICES

(71) Applicant: Macronix International Co., Ltd., Hsinchu (TW)

(72) Inventors: Shuo-Nan Hung, Zhubei (TW); E-Yuan Chang, Chiayi (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/953,439

(22) Filed: Sep. 27, 2022

(65) Prior Publication Data

US 2023/0015202 A1    Jan. 19, 2023

Related U.S. Application Data

(63) Continuation of application No. 17/089,972, filed on Nov. 5, 2020, now Pat. No. 11,461,025.

(51) Int. Cl.
*G06F 3/06* (2006.01)

(52) U.S. Cl.
CPC .......... *G06F 3/0632* (2013.01); *G06F 3/0604* (2013.01); *G06F 3/0619* (2013.01); *G06F 3/0655* (2013.01); *G06F 3/0679* (2013.01)

(58) Field of Classification Search
CPC .... G06F 3/0632; G06F 3/0604; G06F 3/0619; G06F 3/0655; G06F 3/0679; G06F 3/0616; G06F 3/0638; G06F 3/0652; G06F 3/0653; G06F 3/0658; G06F 11/0754; G06F 11/0793; G06F 11/1048; G06F 11/073; G06F 11/1068; G11C 16/3495; G11C 29/028; G11C 29/52; G11C 2029/0409

See application file for complete search history.

(56) References Cited

U.S. PATENT DOCUMENTS

| | | | | |
|---|---|---|---|---|
| 2011/0258496 A1* | 10/2011 | Tseng | ............... | G11C 11/5642 714/704 |
| 2013/0055046 A1* | 2/2013 | Blodgett | ............. | G06F 11/0793 714/764 |
| 2014/0269090 A1 | 9/2014 | Flynn et al. | | |
| 2017/0229182 A1 | 8/2017 | Lin et al. | | |
| 2020/0105351 A1 | 4/2020 | Park et al. | | |
| 2020/0192826 A1* | 6/2020 | Ben-Simon | ......... | G06F 12/1491 |

(Continued)

*Primary Examiner* — Hiep T Nguyen

(74) *Attorney, Agent, or Firm* — Fish & Richardson P.C.

(57) ABSTRACT

A memory controller accesses a memory page in a memory block of a storage memory array of a memory device. The memory controller reads memory data stored in the accessed memory page. The memory controller determines a number of error bits associated with the memory data. The memory controller obtains an erase count corresponding to the accessed memory page, the erase count indicating a number of erase operations performed on the accessed memory page. The memory controller determines, from among one or more error threshold values, an error threshold value based at least on the erase count. The memory controller determines a relationship between the number of error bits and the error threshold value. The memory controller triggers a data refresh for the accessed memory block if the relationship between the number of error bits and the error threshold value satisfy a known criterion.

18 Claims, 3 Drawing Sheets

(56) References Cited

U.S. PATENT DOCUMENTS

| | | |
|---|---|---|
| 2020/0234780 A1 | 7/2020 | Papandreou et al. |
| 2020/0409845 A1* | 12/2020 | Lee .................... G06F 12/0804 |
| 2021/0193246 A1 | 6/2021 | Jo et al. |

* cited by examiner

DATA RETENTION IN MEMORY DEVICES

CROSS-REFERENCE TO RELATED APPLICATIONS

This application is a continuation application of and claims the benefit of priority to U.S. application Ser. No. 17/089,972, filed on Nov. 5, 2020, the contents of which are hereby incorporated by reference.

TECHNICAL FIELD

The following disclosure relates generally to memory devices, and in particular, to methods, apparatus and systems related to improving data retention performance of semiconductor memory devices, leading to longer lifetimes of the memory devices.

BACKGROUND

A semiconductor memory device includes storage memory, for example, flash memory, and a memory controller that manages the storage memory. The memory controller receives commands from a host device to perform operations on data stored in the storage memory.

SUMMARY

The present disclosure describes methods, apparatus and systems to improve data retention in a semiconductor memory device, leading to longer lifetime of the memory device. The memory device includes a storage memory with one or more arrays of memory cells for storing data, and a memory controller to manage access to the storage memory, for example, upon receiving read or program/write commands from a host device that is coupled to the memory device. The memory controller rewrites the data stored in one or more memory cells, such as when data losses (for example, measured in number of bits that have changed from their correct values) exceed certain threshold values (for example, in units of number of bits) due to repeated accesses to the memory cells to perform program, or erase operations. In some implementations, when data losses exceed the threshold values, the memory controller reports the error or loss status (for example, that data losses exceed the threshold values) to the host device, and the host device controls rewriting the data.

In some implementations, the memory controller uses an error checking engine to compare a number of bits in a memory unit (for example, a memory block or memory page) that are in error (referred to as "error bits," for example, bits whose values have changed from their correct values), to one or more error threshold values for error bits. If the number of error bits satisfies a specified relation to a selected error threshold value of the one or more error threshold values, then the memory controller rewrites the data stored in the corresponding memory unit to prevent data loss, or reports the error status to the host device (for example, by raising an error threshold flag to indicate the error status), or both. To compare the error bits to a threshold value, the memory controller stores, for a memory unit, an erase count that indicates how many times the memory unit has been erased, which indicates, for example, a number of program/erase cycles for the memory unit. The memory controller maps the erase count for the memory unit to an erase count range from two or more erase count ranges, where an erase count range is associated with an error threshold value that is different from another error threshold value associated with a different erase count range. For example, in some implementations, a higher error threshold value is associated with a lower erase count range (for example, number of erase operations of a memory unit being in a lower range of erase operations), and a lower error threshold value is associated with a higher erase count range (for example, number of erase operations of the memory unit being in a higher range of erase operations). In some implementations, the memory controller stores the erase count for a memory unit within a specified section of the memory unit (for example, storing the erase count in a known section of a memory page). In some implementations, the error threshold values include Error Correcting Code (ECC) threshold values.

An error computation engine (for example, an ECC engine) in the memory controller determines the error threshold value associated with a memory unit depending on the erase count for the memory unit; compares the number of error bits for the memory unit (for example, bits whose values have changed from their correct values due to memory write or erase disturbance) to the determined error threshold value; and outputs a result of the comparison. The memory controller is configured to report and/or perform a refresh (for example, data rewrite) of the data stored in the memory unit depending on the relation between the number of error bits and the associated error threshold value. For example, in some implementations, if the number of error bits equals or exceeds the corresponding error threshold value, then the memory controller raises an error threshold flag to report the status to the host device, or performs a data refresh to prevent loss of data, or both (for example, reporting the status to the host device, and performing a refresh upon receiving a command from the host device in response to the status report).

In some implementations, as the erase count for a memory unit changes, a different error threshold value is used for the memory unit. For example, if the memory unit is erased more frequently, then the erase count for the memory unit increases and maps to a higher erase count range. In such cases, a new error threshold value is associated with the memory unit, where the newly associated error threshold value is lower than an error threshold value that was previously associated with the memory unit. In such implementations, the new lower threshold value triggers memory refresh for a lower number of error bits compared to previous situations. Accordingly, the memory controller refreshes the data stored in the memory unit even when fewer number of memory bits are in error, which mitigates the likelihood of data loss due to the increase in program/erase cycles for the memory unit.

In a general aspect, a method includes accessing, by a memory controller, a memory page in a memory block of a storage memory array of a memory device, where the storage memory array is managed by the memory controller. The memory controller reads memory data stored in the accessed memory page. The memory controller determines a number of error bits associated with the memory data. The memory controller obtains an erase count corresponding to the accessed memory page, the erase count indicating a number of erase operations performed on the accessed memory page. The memory controller determines, from among one or more error threshold values, an error threshold value based at least on the erase count. The memory controller determines a relationship between the number of error bits and the error threshold value. The memory controller triggers a data refresh for the accessed memory block if the relationship between the number of error bits and the error threshold value satisfy a known criterion.

Particular implementations may include one or more of the following features. The erase count may include one of a program/erase cycle count, or information indicating an access rate of the accessed memory block. Determining the relationship between the number of error bits and the error threshold value may comprise comparing the number of error bits to the error threshold value. Triggering the data refresh conditioned on the relationship satisfying a known criterion may comprise determining if the number of error bits equals or exceeds the error threshold value, and if so, triggering the data refresh for the accessed memory block.

Triggering the data refresh for the accessed memory block may comprise setting a flag corresponding to the accessed memory block, the flag indicating that a data refresh of the accessed memory block is to be performed. A host device coupled to the memory device may read the flag and determine that the flag indicates that a data refresh of the accessed memory block is to be performed. In response to determining that the flag indicates that a data refresh of the accessed memory block is to be performed, the host device may perform a data refresh of the accessed memory block.

An error threshold value of the one or more error threshold values may specify a number of bits of memory data to be in error to trigger a data refresh. A higher erase count may be associated with a lower error threshold value while a comparatively lower erase count may be associated with a comparatively higher error threshold value.

The erase count may be within a specified first range of erase counts of a plurality of ranges of erase counts, the first range of erase counts being associated with the error threshold value. The memory controller may access, at a second time, the accessed memory page and determine an updated erase count corresponding to the accessed memory page at the second time. The memory controller may determine that the updated erase count is within a specified second range of erase counts of the plurality of ranges of erase counts, the second range being different than the first range. The memory controller may determine, from among the one or more error threshold values, a second error threshold value based at least on the updated erase count. The second error threshold value may be different than the error threshold value and wherein the second range of erase counts is associated with the second error threshold value. The updated erase count may be greater than the erase count, and the second error threshold value may be less than the error threshold value.

Implementations include a memory device comprising a storage memory including one or more memory cell arrays; and a memory controller to manage access to the memory cell arrays, wherein the memory controller is configured to perform the above-described operations. Implementations also include a memory controller for managing a memory device, where the memory controller comprises one or more processors; and one or more machine-readable media storing instructions that, when executed, cause the one or more processors to perform the above-described operations.

Implementations further include non-transitory computer-readable media and systems. One such non-transitory computer-readable media stores instructions that, when executed, cause one or more processors to perform the above-described operations. One such system includes a memory device with a memory controller to manage access to one or more memory cell arrays in the memory device, wherein the memory controller is configured to perform the above-described operations. In some implementations, one such system includes a host device communicably coupled to memory device and configured to access the memory cell arrays. In such implementations, the memory controller is configured to report the error status to the host device, and the host device is configured to perform the refresh/rewrite (for example, by sending a refresh/rewrite command to the memory controller) upon determining the error status.

Using the novel features described above and in the following sections of this specification, the lifetime or performance, or both, of semiconductor memory devices, such as flash memory devices, can be improved. Conventional techniques for flash memory devices address data retention or read disturb issues by periodically re-writing the stored data to ensure that the data is not permanently corrupted when the data losses exceed an error correction threshold range. The periodic rewriting is typically done at a fixed rate. However, as a memory unit is accessed more frequently and the program/erase cycle of the memory unit increases, the data is more likely to suffer losses, while losses are less likely for a memory unit with less frequent accesses. In such cases, applying the same periodic re-writing rate to a memory unit irrespective of changes in the frequency of access, can cause unnecessary write cycles due to data rewriting at low access ranges. Such wasteful write cycles may reduce useful life of the memory units, causing an overall decrease in longevity of the memory device.

In contrast, using the disclosed techniques, when the erase count for a memory unit is in a lower erase count range, the memory controller has erased the memory unit less frequently, such that the data stored in the memory unit is less likely to suffer losses between checks, which motivate setting a higher error threshold value for memory units within this erase count range. In some implementations, when the number of data error bits is lower than the corresponding error threshold value, the stored data can be read accurately, and there is no need to refresh the data. However, the data is refreshed if the number of data error bits exceeds the error threshold value. As the number/frequency of program/erase cycles to the memory unit increases, the erase count for the memory unit increases and maps to a higher erase count range, which has a corresponding lower error threshold value that is adjusted for a worse data loss rate due to the increased program/erase cycles. Accordingly, the memory controller dynamically adjusts the error threshold value for a memory unit depending on the erase rate for the memory unit, addressing higher data loss rates correctly. In this manner, the disclosed techniques dynamically adjust data refresh operations, and limit the frequency of refresh operations to situations where refresh operations are needed to prevent data loss, avoiding unnecessary cycles for data refresh at lower erase rates. In doing so, the disclosed techniques lengthen the lifetime of the memory units, and of the one or more arrays that include the memory units. The disclosed techniques thus improve data retention capabilities for the memory devices.

The disclosed techniques can be applied to various types of non-volatile memory devices that can suffer from data retention issues or read disturbance issues. For example, the disclosed techniques can be applied to NAND flash memory, NOR flash memory, or phase change memory (PCM), among others. Additionally or alternatively, the techniques can be applied to various types of main or cache memory devices, such as resistive random access memory (ReRAM), or MRAM, among others.

The details of one or more disclosed implementations are set forth in the accompanying drawings and the description

BRIEF DESCRIPTION OF THE DRAWINGS

Like reference numbers in the figures indicate like elements.

DETAILED DESCRIPTION

Figure 1:
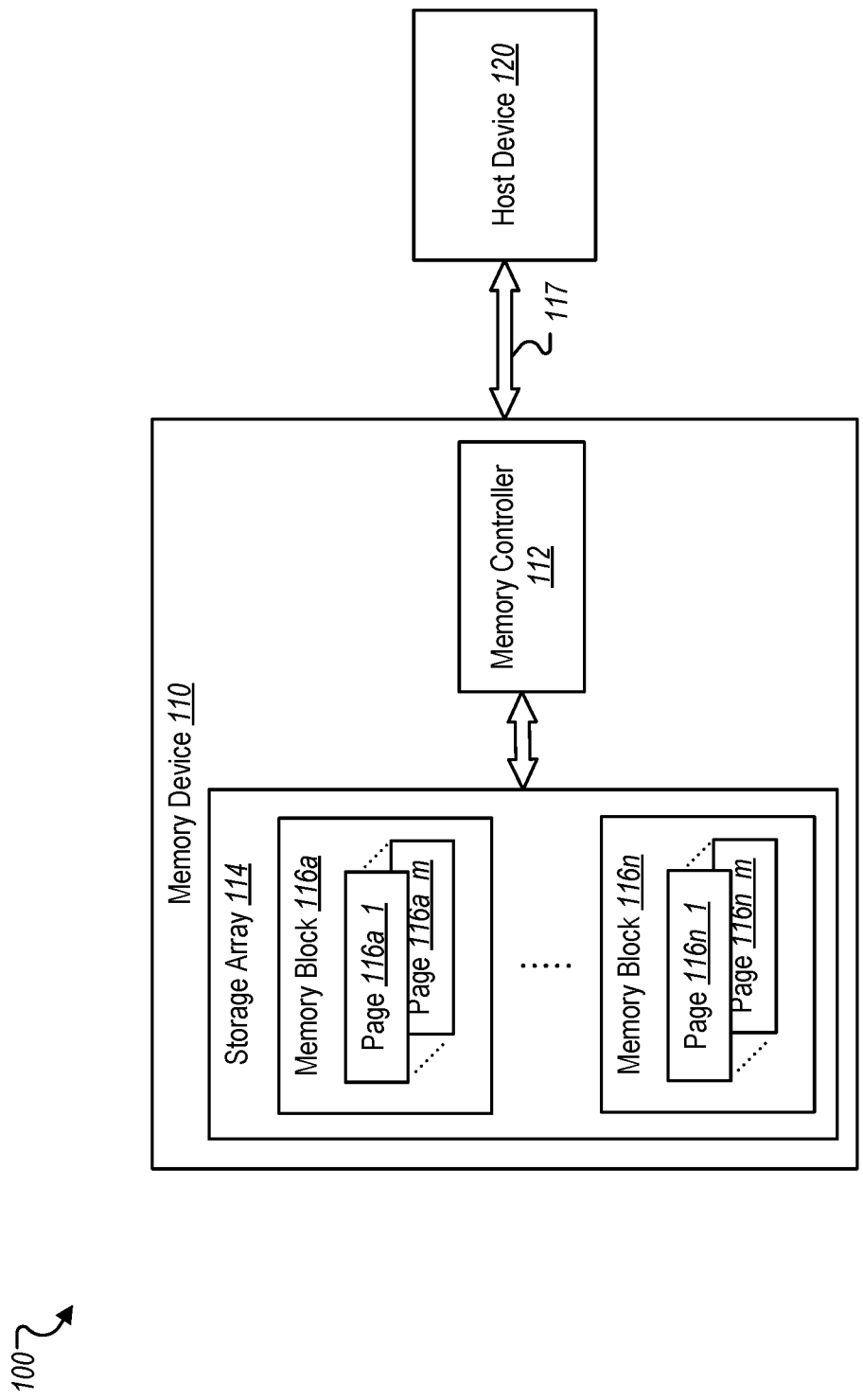
FIG. 1 illustrates a block diagram of an example system that uses variable error threshold values for refresh operations.

FIG. 1 illustrates a block diagram of an example system 100 that uses variable error threshold values for refresh operations. The system 100 includes the memory device 110 that is coupled to a host device 120 using a bus 117. The memory device 110 includes a memory controller 112, and a storage array 114 that stores data and other information.

In some implementations, the memory device 110 is a storage device. For example, the memory device 110 can be an embedded multimedia card (eMMC), a secure digital (SD) card, a solid-state drive (SSD), or some other suitable storage. In some implementations, the memory device 110 is a client device that is coupled to a host device 120. For example, the memory device 110 can be an SD card that is coupled to a digital camera or a media player as the host device 120.

The memory controller 112 manages access to, and operations performed on, the storage array 114. The following sections describe the various techniques based on implementations in which the memory controller 112 is used to manage the storage array 114. However, the techniques described in the following sections are also applicable in implementations in which another type of controller in the memory device 110, different from a memory controller, is used to manage the storage array 114.

In some implementations, the storage array 114 is a non-volatile memory, for example, a NAND or NOR flash memory, or some other suitable non-volatile memory. In implementations where the storage array 114 is NAND or NOR flash memory, the memory device 110 is a flash memory device, for example, a flash memory card, and the memory controller 112 is a flash controller. For example, in some cases, the memory device 110 is a Serial Peripheral Interface (SPI) device, with the storage memory being NOR or NAND flash memory. For illustration purposes, the following description uses a flash memory as an example of the storage array 114.

As shown, the storage array 114 includes a plurality of memory blocks, memory blocks 116a to 116n. A memory block in turn includes one or more memory pages. For example, memory block 116a includes memory pages 116a_1, ... , 116a_m; and memory block 116n includes memory pages 116n_1, ... , 116n_m. A memory page is composed of one or more memory cells. The memory blocks and constituent memory pages are configured to store data or instructions, or both in the memory cells, for use by the host device 120. The memory cells can include single-level cells (SLC), a multi-level cells (MLC), a triple-level cell (TLC), a quad-level cell (QLC), or a higher level memory cell beyond QLC, or any combination of these. An SLC stores one bit of data per memory cell; an MLC memory cell stores two bits of data per memory cell; a TLC memory cell stores three bits of data per memory cell; a QLC memory cell stores four bits of data per memory cell; and a higher level memory cell beyond QLC stores five or more bits of data per memory cell.

The memory controller 112 is a general-purpose microprocessor or microcontroller, or an application specific integrated circuit (ASIC) chip, among other suitable types. The memory controller 112 receives write or read commands from the host device 112 through the bus 117, and accordingly performs write or read operations, respectively, on the storage array 114. The memory controller 112 also performs housekeeping operations on the storage array, for example during idle times when there are no read or write commands from the host device 120 being serviced. The housekeeping operations include reporting, to the host device 120, error status of memory pages in the memory blocks 116a, ... , 116n, when the error bits for the data satisfy predetermined conditions, for example when the error bits equal or exceed error threshold values. Additionally or alternatively, the housekeeping operations include refresh operations of memory pages in the memory blocks 116a, ... , 116n, to optimize lifetime or performance of the storage array 114. The memory refresh operations include rewriting data stored in portions of the memory array 114 to other portions of the memory array when the error bits for the data satisfy predetermined conditions, for example when the error bits equal or exceed error threshold values. In some implementations, the memory refresh operations are performed upon receiving a command from the host device 120, in response to reporting the error status to the host device. In some implementations, the memory controller 112 performs refresh operations at the granularity of memory pages, such as memory pages 116a_1, 116a_m, 116n_1, or 116n_m. In some other implementations, the memory controller 112 performs refresh operations at the granularity of memory blocks, such as memory blocks 116a or 116n. The refresh operations can also be performed for other suitable memory units as well.

In the following sections, the refresh operations performed by the disclosed techniques are described with respect to the memory pages. However, the techniques can also be used to refresh memory units of a different granularity in the storage array 114, such as memory blocks or memory cells, among others.

In some implementations, the memory controller 112 tracks the number of times a memory page is erased, and stores the number as the erase count for the memory page. For example, the memory controller 112 tracks how many times each of the memory pages 116a_1, 116a_m, 116n_1, or 116n_m is erased, and stores the erase count for each page.

As described in greater detail below, in some implementations, the memory controller 112 stores the erase count for a page in memory cells within the page. For example, in such implementations, the memory controller 112 stores the erase counts for one or more of the pages 116a_1, 116a_m, 116n_1, or 116n_m in memory cells within the respective pages. In other implementations, the memory controller 112 stores the erase count for a page in different locations. For example, the memory controller 112 can store the erase counts for one or more of the pages 116a_1, 116a_m, 116n_1, or 116n_m in memory pages or memory blocks that are distinct from the pages 116a_1, 116a_m, 116n_1, or 116n_m, such as a memory page or memory block dedicated to storing erase counts. As another example, the memory controller 112 can store the erase counts for one or more of the pages 116a_1, 116a_m, 116n_1, or 116n_m in registers or other suitable storage distinct from the storage array 114.

In some implementations, a memory page access operation corresponds to an erase operation for the memory page. In such implementations, the erase count represents the number of erase operations for the memory page.

In some implementations, to track whether a memory page should be refreshed to prevent data loss, the memory controller 112 uses two or more erase count ranges, associating a particular error threshold value for each of the erase count range. For a memory page, the memory controller 112 determines the erase count range that covers the erase count for the memory page, and then compares the number of error bits for the memory page to the error threshold value associated with the determined range. If the number of error bits satisfies a known relationship with the error threshold value, then the memory controller 112 sets a flag to trigger an error status report, or a refresh of the memory page, or both. In some implementations, upon determining that the flag is set, the host device 120 performs the refresh operation, for example, by reading the data in the memory block, storing the data externally, erasing the memory block and then writing the data back to the original memory address. In some implementations, the relationship is a "greater than or equal" relationship. In such implementations, if the number of error bits for the memory page is greater than or equal to the error threshold value associated with the determined range, then the memory controller 112 proceeds to refresh the memory page. Other suitable relationships can also be used in various implementations. In some implementations, when the number of error bits satisfies the known relationship with the error threshold value, the memory controller 112 performs the refresh operation, without receiving any refresh instructions from the host device 120.

In some implementations, different error threshold values are associated with different erase count ranges, with the error threshold value associated with an erase count range being different from error threshold values for other erase count ranges. In some cases, a higher error threshold value is associated with a lower erase count range, and a lower error threshold value is associated with a higher erase count range. For example, in some cases, four erase count ranges (measured in units of cycles) can be configured for the memory device 110:

0-100 program/erase cycles (referred to as range A);
101-1000 program/erase cycles (referred to as range B);
1001-10,000 program/erase cycles (referred to as range C); and
10,001-100,000 program/erase cycles (referred to as range D).

Assuming that the error correction engine in the memory controller 112 can correct up to 8 bit errors, the error threshold values associated with the four different erase count ranges can be:

Range A (0-100 program/erase cycles): error threshold value=8 bits;
Range B (101-1000 program/erase cycles): error threshold value=7 bits;
Range C (1001-10,000 program/erase cycles): error threshold value=6 bits; and
Range D (10,001-100,000 program/erase cycles): error threshold value=4 bits.

When a memory page is in a lower erase count range (for example, range A), the memory page has been erased a small number of times such that the data stored in the memory page is less likely to have been corrupted between each checks. Accordingly, a higher error threshold value is associated with this lower erase count range. As the number of erase operations of the memory page increases, the probability of data loss for the memory page increases due to more frequent erase operations. This is reflected in the lower error threshold value for higher erase count ranges. With the increase in number of erase operations, the erase count for the memory page enters the next higher erase count range (for example, range B), which has a lower error threshold value (compared to the lower erase count range, range A) that is adjusted for a worse data loss rate. When the erase count for the memory page is in range A, the memory controller 112 determines whether to rewrite the data based on comparing the error bits for the memory page to the error threshold value of 8 bits. However, when the erase count for the memory page is in the next higher range B, the memory controller 112 determines whether to rewrite the data based on comparing the error bits for the memory page to a lower error threshold value of 7 bits.

The above erase count ranges and the corresponding error threshold values are for illustrative purposes only. Different implementations can use different erase count ranges, or error threshold values, or both. For example, in some cases, the erase count ranges can include: 0-100 cycles; 100-500 cycles; 500-5000 cycles; 5000-10,000 cycles, or other suitable values. The error threshold values can be 16 bits (for example, when the error correction engine can correct up to 16 bit errors), 14 bits, 12 bits, 10 bits, or other suitable values.

In some implementations, the erase count ranges or the corresponding error threshold values, or both, are configured by a manufacturer of the memory device 110. In some implementations, the erase count ranges or the corresponding error threshold values, or both, can be configured by a user (for example, a device administrator) of the memory device 110. The device manufacturer may ship the memory device 110 with default values for the erase count ranges and corresponding error threshold values (for example, depending on the silicon manufacturing process), but the user of the memory device 110 can change the values before deployment according to the user's specific needs.

Figure 2:
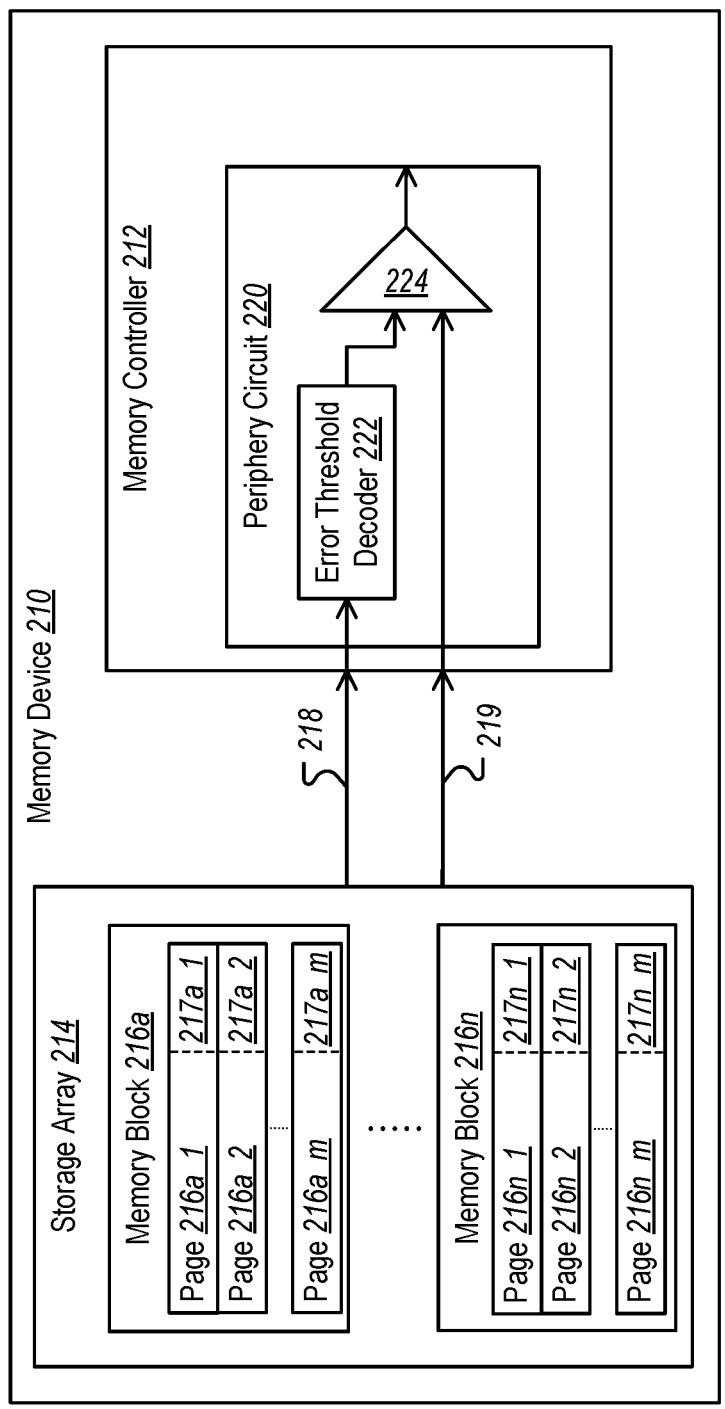
FIG. 2 illustrates a block diagram of an example memory device that stores erase counts within memory pages in the memory device, for use in dynamically adjusting error threshold values for refresh operations.

As mentioned previously, in some implementations, the memory controller 112 stores the erase count for a page in a section of the page, for example, in memory cells within the page. FIG. 2 illustrates a block diagram of an example memory device 210 that stores erase counts within memory pages in the memory device, for use in dynamically adjusting error threshold values for refresh operations. The memory device 210 includes a memory controller 212, and a storage array 214 that stores data and other information. As shown, the storage array 114 includes a plurality of memory blocks, for example, memory blocks 216a to 216n. A memory block includes one or more memory pages. For example, memory block 216a includes memory pages 216a_1, 216a_2, . . . , 216a_m; and memory block 216n includes memory pages 216n_1, 216n_2, . . . , 216n_m.

In some implementations, the memory device 210 is similar to the memory device 110 in the system 100. In such implementations, the memory controller 212 is similar to the memory controller 112. Also, the storage array 214 is similar to the storage array 114, with memory blocks 216a to 216n being similar to memory blocks 116a to 116n respectively, and constituent memory pages 216a_1, . . . , 216a_m, and 216n_1, . . . , 216n_m, being similar to memory pages 116a_1, . . . , 116a_m, and 116n_1, . . . , 116n_m, respectively. In such implementations, the memory device 210 is connected to a host device, for example, a host device similar to the host device 120.

As shown in FIG. 2, in some implementations, erase counts for memory pages in the storage array 214 are stored in sections of the memory pages themselves. For example, memory pages 216a_1, 216a_2, . . . , 216a_m include respective sections 217a_1, 217a_2, . . . , 217a_m, to store erase counts. Similarly, memory pages 216n_1, 216n_2, . . . , 216n_m include respective sections 217n_1, 217n_2, . . . , 217n_m, to store erase counts. In some implementations, the memory controller 212 uses the designated section within a memory page to store the erase count for the memory page itself. For example, in such implementations, the memory controller 212 stores the erase count for memory page 216a_1 in the section 217a_1 of the memory page 216a_1, and stores the erase count for memory page 216n_1 in the section 217n_1 of the memory page 216n_1. However, in some other implementations, the memory controller 212 stores the erase count for at least some memory pages in the designated sections of other memory pages. For example, the memory controller 212 can store the erase count for memory page 216a_1 in one of the sections 217a_2, 217a_m, or 217n_1, or sections in other memory pages. As mentioned previously, other suitable combinations of memory units and erase count storage of the memory units are also possible.

In some implementations, the memory controller 212 assigns a known number of memory cells in each memory page to store the erase count. The number of memory cells assigned depends on the number of bits needed to represent the erase count value, and the number of bits that can be stored in a memory cell, among other parameters. For example, in cases where the memory controller 212 tracks up to 100,000 erase cycles, 17 bits can be used to store up to 100,000 erase cycles. If SLC cells are used, for example depending on the type of cells used in the storage array 214, then an erase count storage section, for example, one or more of sections 217a_1, 217a_2, . . . , 217a_m, 217n_1, 217n_2, . . . , or 217n_m, can include 17 SLC cells. However, if MLC cells are used, then an erase count storage section can include 9 SLC cells.

As shown in FIG. 2, the memory controller 212 includes, among other components, a periphery circuit 220 that is used to check erase counts for the memory pages in the storage array 214, and compare the erase counts to error threshold values. The periphery circuit 220 includes an error threshold decoder 222 and a comparator circuit 224. The memory controller 212 obtains the erase count stored for a memory page and sends the erase count to the error threshold decoder 222, as shown by the input 218 to the error threshold decoder 222. For example, upon reading memory page 216a_1 (for example, in response to receiving a read command from the connected host device), the memory controller 212 obtains the current erase count for the memory page 216a_1, for example, from the section 217a_1, to determine whether the memory page 216a_1 needs to be refreshed. The memory controller 212 sends the erase count to the error threshold decoder 222, which determines an erase count range (from among the ranges used by the memory device 210) that encompasses the current erase count for the memory page, and identifies an error threshold value associated with the determined erase count range.

The error threshold decoder 222 outputs the error threshold value, which is provided as an input to the comparator 224. The memory controller 212 also reads out the data stored in the memory page (for example, for the memory page 216a_1 in the above example) and calculates the number of error bits for the data. The number of error bits is provided as another input to the comparator 224, as shown by the input 219 to the comparator 224.

The comparator 224 compares the number of error bits and the error threshold value to determine if these values satisfy a known relationship, and outputs a value of an error threshold flag that indicates a result or status of the comparison. For example, if the number of error bits and the error threshold value satisfies the relationship (such as, the number of error bits being equal to or greater than the error threshold value in some implementations), then the comparator 224 outputs a value of the error threshold flag to indicate that data refresh for the memory page is needed. The value of the error threshold flag can be "0" or "1," depending on the implementation. On the other hand, if the number of error bits and the error threshold value do not satisfy the relationship (such as the number of error bits being less than the error threshold value in the above example), then the value of the error threshold flag output by comparator 224 indicates that data refresh for the memory page is not needed. In this case, the value of the error threshold flag would be the complement of the value noted above (for example, "0" if the flag value is "1" when the relationship is satisfied, or vice versa). The host 120 accesses the memory controller 212 to get the error threshold flag and determines whether to perform a data refreshment for the memory page (for example, by rewriting the data stored in the memory page to a different memory block in the storage array 214), to prevent the data in the memory page from being irrevocably corrupted. As described previously, in some implementations, the memory controller 212 performs the refresh operation, without receiving any refresh instructions or commands from the host 120.

As described previously, different error threshold values can be associated with different erase count ranges, with lower erase count ranges having higher error threshold values compared to higher erase count ranges in some implementations. Accordingly, as the number of erase cycles for a memory page increases, causing the corresponding erase count to increase and move to higher erase count ranges, the error threshold value can decrease, triggering data refresh with lower number of error bits. In this manner, the memory controller 212 can use dynamically changing conditions to refresh data for a memory page, where the change is at least partly dependent on the number of times the memory page has been erased.

As mentioned previously, in some implementations, the memory device 210 uses an ECC engine to correct for bit errors. The error threshold decoder 222 determines ECC threshold values for the memory pages, and the comparator 224 compares the ECC threshold value to the number of error bits for a memory page.

Figure 3:
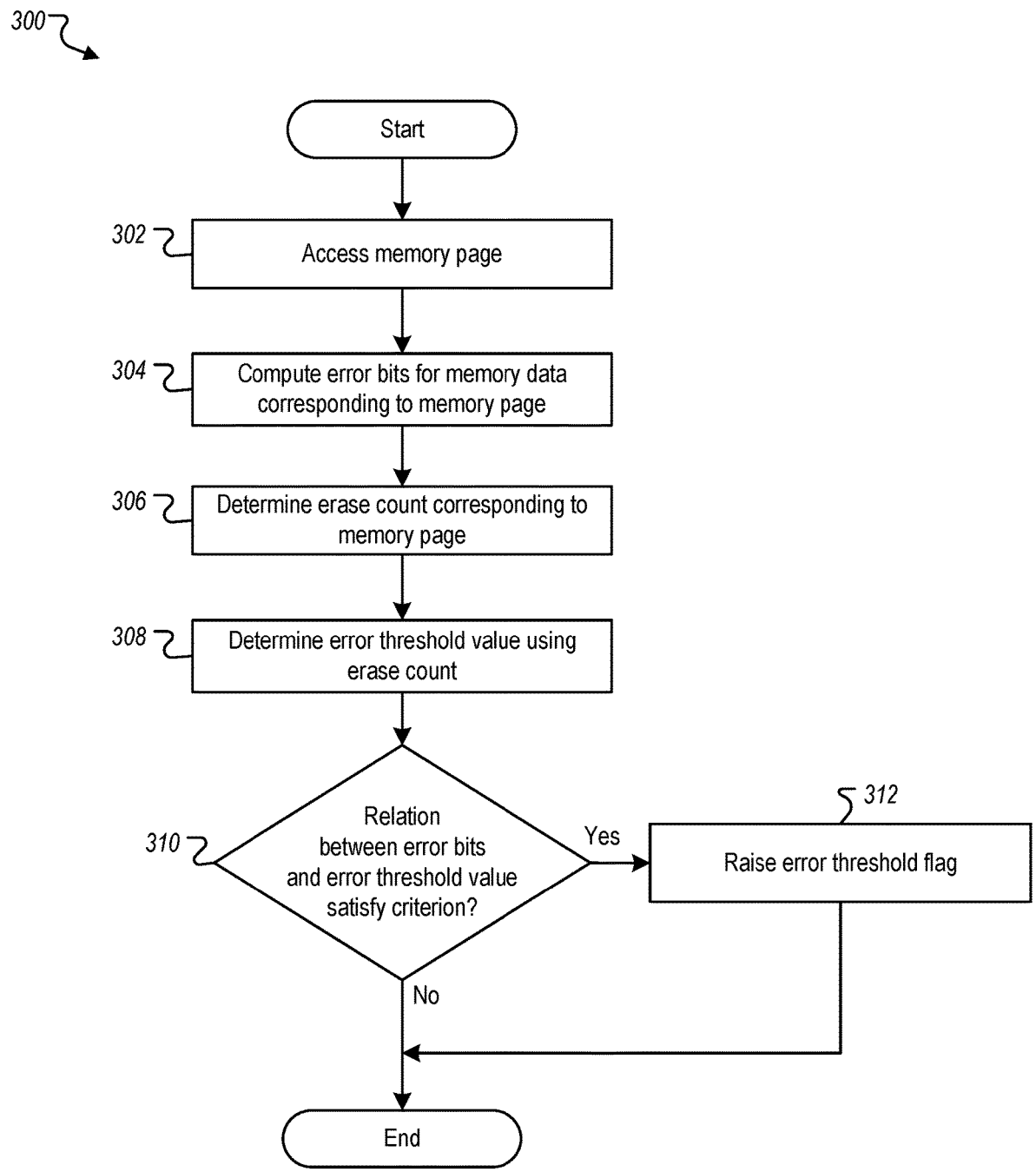
FIG. 3 illustrates an example of a process used by a memory controller to refresh data stored in a memory page in a memory device.

FIG. 3 illustrates an example of a process 300 used by a memory controller to refresh data stored in a memory page in a memory device. In some implementations, the process 300 is performed by the memory controller 212 of the memory device 210 (or equivalently, by the memory controller 112 of the memory device 110) to refresh data stored in memory pages in the memory array 214, such as memory pages 216a_1, 216a_2, . . . , 216a_n in the memory block 216a, or memory pages 217n_1, 217n_2, . . . , 217n_m in the memory block 216n. Accordingly, the following sections describe the process 300 with respect to the memory controller 212. However, the process 300 also may be performed by other devices.

The process 300 starts when the memory controller accesses a memory page (302). For example, upon receiving a read command from a host device, the memory controller 212 determines the physical address of the target memory location by performing an address lookup in an address translation table, and then accesses the corresponding memory page, such as one of memory pages 216a_1, 216a_2, . . . , 216a_m in the memory block 216a, or one of memory pages 216n_1, 216n_2, . . . , 216n_m in the memory block 216n.

Error bits are computed for memory data corresponding to the memory page (304). For example, the memory controller 212 reads out data stored in the memory page (for example, the memory page 216a_1 in the above example) and provides the data to the ECC engine, which calculates the number of error bits for the data. The number of error bits is provided as input to the comparator 224.

The memory controller determines an erase count corresponding to the memory page (306). For example, the memory controller 212 reads, for an accessed memory page, the corresponding erase count that indicates how many times the memory page has been accessed for erase operations. In some implementations, the erase count is stored in a designated section of the memory page, and the memory controller 212 reads the erase count from the designated section of the memory page. For example, in some implementations the erase count for the memory page 216a_1 is stored in the section 217a_1 of the memory page; the memory controller 212 reads the erase count for the memory page 216a_1 from the section 217a_1.

The memory controller determines an error threshold value using the erase count (308). For example, the memory controller 212 provides the erase count determined for a memory page (for example, for the memory page 216a_1 in the above example) to the error threshold decoder 222, which maps the erase count to one of a plurality of erase count ranges used in the memory device 210. The error threshold decoder 222 then determines the error threshold value that is associated with the mapped erase count range. The determined error threshold value is provided as an input to the comparator 224.

The memory controller determines whether a relation between the error bits and the error threshold value satisfy a known criterion (310). For example, in some implementations, the comparator 224 checks whether the number of error bits for the memory page (for example, the memory page 216a_1 in the above example) is equal to or greater than the error threshold value corresponding to the erase count for the memory page, and provides an output value that indicates a result of the comparison.

If the relation between the error bits and the error threshold value satisfy the known criterion, then the memory controller raises an error threshold flag (312). For example, in some implementations, when output of the comparator 224 indicates that the number of error bits is equal to or greater than the error threshold value, the memory controller 212 sets the value of the error threshold flag to indicate that data refresh for the memory page is needed (for example, by setting the flag to the value "1"). The host device, for example, host 120, reads the error threshold flag value and determines whether to perform a data refresh operation to prevent the data in the memory page from being irrevocably corrupted. In some implementations, the host device proceeds with the data refresh operation, for example, by reading out and temporarily storing the data externally, and then writing each page of data to a different memory page in the storage array 214.

On the other hand, if the relation between the error bits and the error threshold value do not satisfy the known criterion, then the process 300 ends. For example, in some implementations, when the output of the comparator 224 indicates that number of error bits is less than the error threshold value, the memory controller 212 sets the value of the error flag to indicate that data refresh for the memory page is not needed. In such implementations, the host device, for example, host 120, reads the flag value and realizes that the number of error bits for the data stored in the memory page is within recoverable ranges, such that rewriting the data to another section of the storage array 214 is not needed. In the above manner, the memory controller 212 uses the process 300 to refresh memory data using variable error threshold values, which are dynamically applied to a memory unit depending on the erase count of the memory unit, leading to improvement in lifetime of the storage array 214.

It is to be noted that although process steps, method steps, algorithms or the like may be described in a sequential order above, such processes, methods and algorithms may generally be configured to work in alternate orders, unless specifically stated to the contrary.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, for example, code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, for example, code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (for example, one or more scripts stored in a markup language document), in a single file dedicated to the program in question, or in multiple coordinated files (for example, files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, for example, an FPGA or an ASIC (application specific integrated circuit).

Processors suitable for the execution of a computer program include, by way of example, both general and special purpose microprocessors, and any one or more processors of any kind of digital computer. Computer readable media suitable for storing computer program instructions and data can include all forms of nonvolatile memory, media and memory devices. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method performed by a memory controller, the method comprising:
   accessing a memory page in a memory block of a memory device;
   determining a number of error bits associated with memory data stored in the memory page;
   accessing a specified portion of the memory block comprising one or more memory cells storing an erase count for the memory page, the erase count indicating a number of erase operations performed on the memory page,
   wherein a number of the one or more memory cells storing the erase count corresponds to a maximum number of error bits associated with memory data that can be corrected by the memory controller;
   obtaining the erase count for the memory page from the specified portion of the memory block;
   determining, based at least on the obtained erase count for the memory page, an error threshold value for the memory data stored in the memory page;
   comparing the number of error bits associated with memory data to the error threshold value;
   in response to the comparing, determining that the number of error bits is greater than or equal to the error threshold value; and
   upon determining that the number of error bits is greater than or equal to the error threshold value, causing a data refresh for the memory page.

2. The method of claim 1, wherein causing the data refresh for the memory page comprises:
   setting a flag associated with the memory page to indicate that the memory page is a candidate for a data refresh.

3. The method of claim 2, further comprising:
   determining, by a host device coupled to the memory device, that the flag associated with the memory page is set; and
   in response to determining that the flag associated with the memory page is set, performing, by the host device, a data refresh of the memory page.

4. The method of claim 1, wherein the error threshold value is one of a plurality of error threshold values, each of which corresponds to a different range of erase counts to trigger a data refresh, and
   wherein a higher range of erase counts is associated with a lower error threshold value while a lower range of erase counts is associated with a higher error threshold value.

5. The method of claim 1, wherein the erase count includes one of a program/erase cycle count, or information indicating an access rate of the memory page.

6. The method of claim 1, wherein the specified portion of the memory block storing the erase count for the memory page includes a specified section of the memory page, and wherein accessing the specified portion of the memory block comprises accessing the specified section of the memory page.

7. The method of claim 1, wherein the specified portion of the memory block storing the erase count for the memory page includes a section of a different, second memory page.

8. A memory device comprising:
   a memory array including a one or more memory blocks, with at least one memory block including one or more memory pages; and
   a memory controller configured to perform operations comprising:
      accessing a memory page in a memory block of the one or more memory blocks;
      determining a number of error bits associated with memory data stored in the memory page;
      accessing a specified portion of the memory block comprising one or more memory cells storing an erase count for the memory page, the erase count indicating a number of erase operations performed on the memory page,
      wherein a number of the one or more memory cells storing the erase count corresponds to a maximum number of error bits associated with memory data that can be corrected by the memory controller;
      obtaining the erase count for the memory page from the specified portion of the memory block;
      determining, based at least on the obtained erase count for the memory page, an error threshold value for the memory data stored in the memory page;
      comparing the number of error bits associated with memory data to the error threshold value;
      in response to the comparing, determining that the number of error bits is greater than or equal to the error threshold value; and upon determining that the number of error bits is greater than or equal to the error threshold value causing a data refresh for the memory page.

9. The memory device of claim 8, wherein the memory controller comprises:
a decoder configured to determine, based at least on the obtained erase count for the memory page, the error threshold value for the memory data from a plurality of error threshold values, each of which corresponds to a different range of erase counts to trigger a data refresh; and
a comparator configured to compare the number of error bits to the error threshold value.

10. The memory device of claim 8, wherein causing the data refresh for the memory page comprises:
setting a flag associated with the memory page to indicate that the memory page is a candidate for a data refresh.

11. The memory device of claim 10, wherein a host device coupled to the memory device is configured to perform a data refresh of the memory page in response to determining that the flag associated with the memory page is set.

12. The memory device of claim 8, wherein the erase count includes one of a program/erase cycle count, or information indicating an access rate of the memory page.

13. The memory device of claim 8, wherein the specified portion of the memory block storing the erase count for the memory page includes a specified section of the memory page, and wherein accessing the specified portion of the memory block comprises accessing the specified section of the memory page.

14. The memory device of claim 8, wherein the specified portion of the memory block storing the erase count for the memory page includes a section of a different, second memory page.

15. A method performed by a memory controller, the method comprising:
accessing a first memory page in a memory block of a memory device;
obtaining a first erase count corresponding to the first memory page, the first erase count indicating a number of erase operations performed on the first memory page;
determining, based at least on the first erase count, a first error threshold value of a plurality of error threshold values for first memory data stored in the first memory page, wherein an error threshold value of a plurality of error threshold values indicates a number of error bits in memory data of a memory page to trigger a data refresh for the memory page;
accessing a second memory page in the memory block of the memory device;
obtaining a second erase count corresponding to the second memory page, the second erase count indicating a number of erase operations performed on the second memory page; and
determining, based at least on the second erase count, a second error threshold value for second memory data stored in the second memory page,
wherein the second erase count is greater than the first erase count and the second error threshold value is less than the first error threshold value.

16. The method of claim 15, further comprising:
determining a first number of error bits associated with the first memory data;
comparing the first number of error bits associated to the first error threshold value;
in response to the comparing, determining that the first number of error bits is greater than or equal to the first error threshold value; and
upon determining that the first number of error bits is greater than or equal to the first error threshold value, causing a data refresh for the first memory page.

17. The method of claim 15, further comprising:
determining a second number of error bits associated with the second memory data;
comparing the second number of error bits associated to the second error threshold value;
in response to the comparing, determining that the second number of error bits is less than the second error threshold value; and
upon determining that the second number of error bits is less than the second error threshold value, indicating that the second memory page is not a candidate for a data refresh.

18. The method of claim 15, wherein obtaining the first erase count corresponding to the first memory page comprises accessing a first portion of the memory block configured to store the first erase count, and
obtaining the second erase count corresponding to the second memory page comprises accessing a second portion of the memory block configured to store the second erase count, the second portion being different than the first portion.

* * * * *